(12) United States Patent
Imai

(10) Patent No.: US 7,679,158 B2
(45) Date of Patent: Mar. 16, 2010

(54) RADIATION IMAGE DETECTOR

(75) Inventor: Shinji Imai, Ashigarakami-gun (JP)

(73) Assignee: FUJIFILM Corporation, Tokyo (JP)

( * ) Notice: Subject to any disclaimer, the term of this patent is extended or adjusted under 35 U.S.C. 154(b) by 117 days.

(21) Appl. No.: 12/121,013

(22) Filed: May 15, 2008

(65) Prior Publication Data
US 2008/0283947 A1    Nov. 20, 2008

(30) Foreign Application Priority Data
May 16, 2007    (JP)    ............................. 2007-130592

(51) Int. Cl.
*H01L 31/0272*    (2006.01)

(52) U.S. Cl. .................. 257/439; 257/428; 257/443; 257/444; 257/E31.001; 257/E31.008; 257/E31.009; 257/E31.01

(58) Field of Classification Search ............... 257/428, 257/439, 443, 444, E31.001, E31.008, E31.009, 257/E31.01
See application file for complete search history.

(56) References Cited

U.S. PATENT DOCUMENTS

| 3,685,989 A | 8/1972 | Galen | |
|---|---|---|---|
| 5,818,052 A * | 10/1998 | Elabd | 250/370.09 |
| 2004/0104362 A1 * | 6/2004 | Imai | 250/582 |
| 2007/0023853 A1 * | 2/2007 | Partain et al. | 257/443 |

FOREIGN PATENT DOCUMENTS

JP    2007-213814 A    8/2007

* cited by examiner

*Primary Examiner*—Kiesha R. Bryant
*Assistant Examiner*—Minchul Yang
(74) *Attorney, Agent, or Firm*—Sughrue Mion, PLLC

(57) ABSTRACT

A thermal deformation preventing layer is located between a recording photoconductive layer, which contains a-Se as a principal constituent, and a crystallization preventing layer, which is constituted of an a-Se layer containing at least one kind of element selected from the group consisting of As, Sb, and Bi. The thermal deformation preventing layer is constituted of an a-Se layer containing at least one kind of specific substance selected from the group consisting of a metal fluoride, a metal oxide, $SiO_x$, and $GeO_x$, where x represents a number satisfying $0.5 \leq x \leq 1.5$.

8 Claims, 4 Drawing Sheets

RADIATION IMAGE DETECTOR

BACKGROUND OF THE INVENTION

1. Field of the Invention

This invention relates to a radiation image detector adapted for use in a radiation imaging apparatus, such as an X-ray imaging apparatus.

2. Description of the Related Art

With respect to radiation imaging operations for medical diagnoses, there have heretofore been known radiation imaging apparatuses, in which radiation image detectors (utilizing semiconductors as principal sections) are utilized for detecting radiation and converting the radiation into an electric signal. Ordinarily, the radiation image detectors may be classified into a direct conversion type, wherein the radiation is directly converted into electric charges, and wherein the thus formed electric charges are accumulated; and an indirect conversion type, wherein the radiation is converted into light by use of a scintillator, such as CsI:Tl or GOS ($Gd_2O_2S$:Tb), wherein the thus obtained light is then converted into electric charges by use of a photoconductive layer, and wherein the thus formed electric charges are accumulated. Also, in accordance with read-out techniques, the radiation image detectors may be classified into an optical read-out technique, wherein a read-out operation is performed with a radiation image detector utilizing a semiconductor material capable of generating the electric charges when being exposed to light; and a TFT technique, wherein the electric charges having been generated with the irradiation of the radiation are accumulated, and wherein the accumulated electric charges are read out through an operation, in which an electric switch, such as a thin film transistor (TFT), is turned on and off with respect to each of pixels.

The direct conversion types of the radiation image detectors are constituted for performing a radiation detecting operation, wherein a predetermined bias voltage is applied to a voltage applying electrode, which has been formed on a surface of a radiation-sensitive type of a semiconductor film (acting as a recording photoconductive layer), wherein the carriers having been generated with the irradiation of the radiation are collected by a carrier collecting electrode, which been formed on an opposite surface of the semiconductor film, wherein the thus collected carriers are accumulated at a charge accumulating region, and wherein the electric charges, which depend upon the electric charge quantity having been accumulated at the charge accumulating region, are taken out as a radiation detection signal. Ordinarily, the recording photoconductive layer is formed with amorphous selenium (a-Se) for its advantages of a high dark resistance and a high response speed.

Amorphous selenium is capable of easily coping with the formation of a layer having a large area by the utilization of a thin film forming technique, such as a vacuum evaporation technique. However, amorphous selenium is apt to contain many structure defects and is therefore apt to suffer from deterioration in sensitivity. Accordingly, ordinarily, in order for the performance to be enhanced, amorphous selenium is doped with appropriate quantities of impurities.

In, for example, U.S. Pat. No. 3,685,989, there is described a technique, wherein an appropriate photoconductive layer, through which both the electrons and the holes are capable of transiting, is obtained from processing for doping a-Se or an a-Se:As alloy with an alkali metal in a concentration falling within the range of 5 ppm to 5,000 ppm. However, in cases where a-Se is doped with Na in a concentration of at least 0.01 ppm, the problems are encountered in that interface crystallization is apt to occur at a contact interface with an electrode, in that image defects are apt to arise, in that the characteristics are apt to change due to moisture, and in that the durability is not capable of being kept long.

In order to solve the problems described above, the applicant has proposed a radiation image detector comprising an amorphous selenium layer, which is located as a crystallization preventing layer between a recording photoconductive layer and an electrode, and which contains at least one kind of element selected from the group consisting of As, Sb, and Bi. (The proposed radiation image detector is described in Japanese Unexamined Patent Publication No. 2007-213814.)

However, in cases where the crystallization preventing layer is located between the recording photoconductive layer and the electrode, which is located on the side opposite to a base plate, the new problems were encountered in that reticulations arise on a surface of the crystallization preventing layer with the passage of a long period of time (at least 100 hours) at a high temperature (40° C.). If the reticulations arise on the surface of the crystallization preventing layer, an artifact will occur in an obtained image. It is considered that the reticulations are caused to arise by a factor, such that a thermal expansion coefficient of the recording photoconductive layer (a-Se) is higher than the thermal expansion coefficient of the crystallization preventing layer, and by a factor, such that a modulus of elasticity of a-Se becomes markedly low at a glass transition temperature (40° C.) of a-Se, and resistance to the occurrence of the reticulations thus becomes low.

SUMMARY OF THE INVENTION

The primary object of the present invention is to provide a radiation image detector, which is constituted such that, in cases where a crystallization preventing layer is located between a recording photoconductive layer and an electrode, which is located on the side opposite to a base plate, occurrence of reticulations is capable of being suppressed.

The present invention provides a radiation image detector, comprising:

i) a base plate, ii) a reference electrode constituted of a plurality of electrodes, iii) a recording photoconductive layer, which contains a-Se as a principal constituent, iv) a crystallization preventing layer, which is constituted of an a-Se layer containing at least one kind of element selected from the group consisting of As, Sb, and Bi, and v) a bias electrode, the reference electrode, the recording photoconductive layer, the crystallization preventing layer, and the bias electrode being overlaid in this order on the base plate, a thermal deformation preventing layer being located between the recording photoconductive layer and the crystallization preventing layer, the thermal deformation preventing layer being constituted of an a-Se layer containing at least one kind of specific substance selected from the group consisting of a metal fluoride, a metal oxide, $SiO_x$, and $GeO_x$, where x represents a number satisfying $0.5 \leq x \leq 1.5$.

The radiation image detector in accordance with the present invention should preferably be modified such that the thermal deformation preventing layer has a layer thickness falling within the range of 0.5 μm to 20 μm.

Also, the radiation image detector in accordance with the present invention should preferably be modified such that a concentration of the specific substance falls within the range of 0.005 mol % to 5 mol %.

Further, the radiation image detector in accordance with the present invention should preferably be modified such that a hole blocking layer is located between the thermal deformation preventing layer and the bias electrode.

The radiation image detector in accordance with the present invention comprises:

i) the base plate, ii) the reference electrode constituted of the plurality of the electrodes, iii) the recording photoconductive layer, which contains a-Se as the principal constituent, iv) the crystallization preventing layer, which is constituted of the a-Se layer containing at least one kind of element selected from the group consisting of As, Sb, and Bi, and v) the bias electrode, the reference electrode, the recording photoconductive layer, the crystallization preventing layer, and the bias electrode being overlaid in this order on the base plate, the thermal deformation preventing layer being located between the recording photoconductive layer and the crystallization preventing layer, the thermal deformation preventing layer being constituted of the a-Se layer containing at least one kind of specific substance selected from the group consisting of the metal fluoride, the metal oxide, $SiO_x$, and $GeO_x$, where x represents a number satisfying $0.5 \leq x \leq 1.5$.

Therefore, with the radiation image detector in accordance with the present invention, the occurrence of the reticulations on the surface of the crystallization preventing layer is capable of being suppressed, and the occurrence of an artifact in an obtained image is capable of being suppressed.

Also, with the radiation image detector in accordance with the present invention, wherein the hole blocking layer is located between the thermal deformation preventing layer and the bias electrode, insufficiency of the hole capture capability is capable of being compensated for in cases where the concentration of the specific substance in the thermal deformation preventing layer is low. Therefore, in such cases, the dark current is capable of being suppressed even further. With the radiation image detector in accordance with the present invention, wherein the hole blocking layer is provided, the radiation image detector, in which thermal damage to a-Se is capable of being kept lower and in which durability is longer, is capable of being obtained than in cases where the concentration of the specific substance in the thermal deformation preventing layer is increased.

DESCRIPTION OF THE PREFERRED EMBODIMENTS

The present invention will hereinbelow be described in further detail with reference to the accompanying drawings.

Ordinarily, the radiation image detectors may be classified into the direct conversion type, wherein the radiation is directly converted into electric charges, and wherein the thus formed electric charges are accumulated; and the indirect conversion type, wherein the radiation is converted into light by use of the scintillator, such as CsI:Tl or GOS ($Gd_2O_2S$: Tb), wherein the thus obtained light is then converted into electric charges by use of a photoconductive layer of a-Se, or the like, and wherein the thus formed electric charges are accumulated. The radiation image detector in accordance with the present invention is capable of being employed for both the direct conversion type of the radiation image detector and the indirect conversion type of the radiation image detector. The radiation image detector in accordance with the present invention may be employed for the radiation, such as X-rays, γ-rays, and α-rays.

The radiation image detector in accordance with the present invention may be employed for both the optical read-out technique and the TFT technique.

Figure 1:
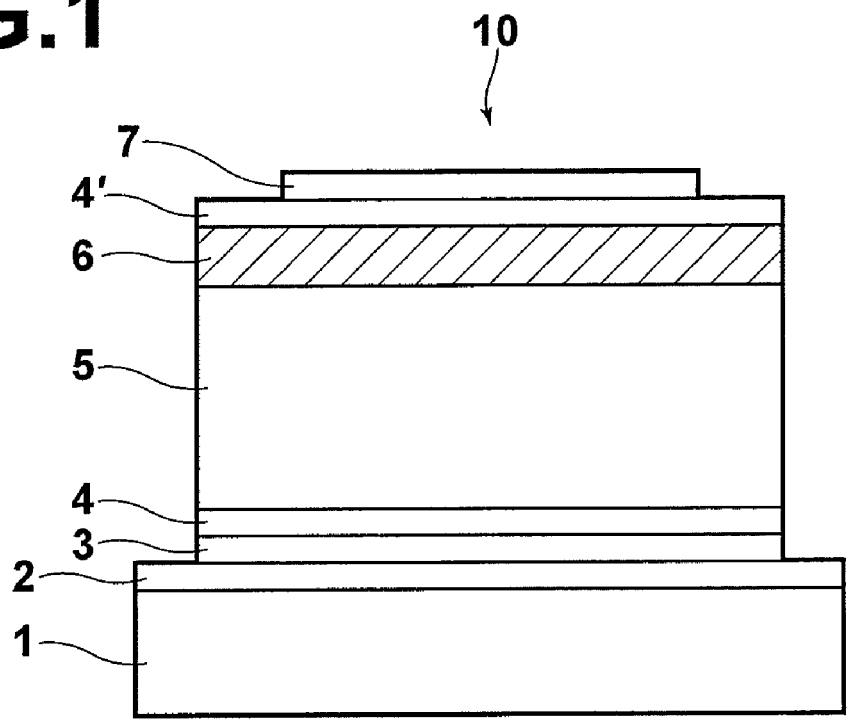
FIG. 1 is a schematic sectional view showing a first embodiment of the radiation image detector in accordance with the present invention.

FIG. 1 is a schematic sectional view showing a first embodiment of the radiation image detector in accordance with the present invention. With reference to FIG. 1, a radiation image detector 10 comprises a base plate 1. The radiation image detector 10 also comprises an active matrix layer 2. The active matrix layer 2 is provided with a read-out circuit, which is constituted of TFT's. The active matrix layer 2 is also provided with accumulating capacitors and charge collecting electrodes. The radiation image detector 10 further comprises an electron blocking layer 3. The radiation image detector 10 still further comprises a crystallization preventing layer 4. The radiation image detector 10 also comprises a recording photoconductive layer 5. The radiation image detector 10 further comprises a thermal deformation preventing layer 6. The radiation image detector 10 still further comprises a crystallization preventing layer 4'. The radiation image detector 10 also comprises a bias electrode 7. The active matrix layer 2, the electron blocking layer 3, the crystallization preventing layer 4, the recording photoconductive layer 5, the thermal deformation preventing layer 6, the crystallization preventing layer 4', and the bias electrode 7 are overlaid in this order on the base plate 1.

Figure 3:
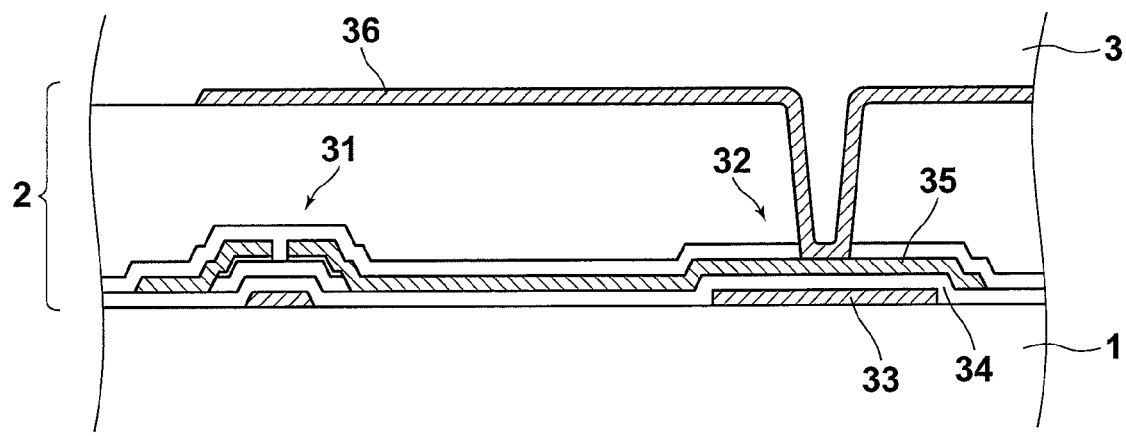
FIG. 3 is an enlarged sectional view showing an active matrix layer.

FIG. 3 is an enlarged sectional view showing an active matrix layer. As illustrated in FIG. 3, the active matrix layer 2 comprises a TFT 31 and an accumulating capacitor 32, which correspond to each of pixels. An output line of each TFT 31 is connected to signal detecting means (not shown). Also, a control line of each TFT 31 is connected to TFT control means (not shown). The accumulating capacitor 32 comprises a bottom electrode 33, an electrical insulating layer 34, a top electrode 35, and a charge collecting electrode 36, which are overlaid in this order on the base plate 1. Of the top electrode 35 of the accumulating capacitor 32, a region of the top electrode 35, which region stands facing the bottom electrode 33, is the region at which the electric charges are induced (accumulated) and which corresponds to the charge accumulating section. Also, the bottom electrode 33 is the electrode, which is to be at reference electric potential with respect to the bias electrode 7. The bottom electrode 33 corresponds to the reference electrode.

The radiation image detector 10 is operated in the manner described below. Specifically, in cases where X-rays are irradiated to the recording photoconductive layer 5 at the time, at which an electric field is being formed across the bias electrode 7 and the reference electrode, pairs of positive and negative charges are generated in the recording photoconductive layer 5, and latent image charges corresponding to the quantity of the pairs of positive and negative charges are accumulated at the charge accumulating section in the active matrix layer 2. In cases where the latent image charges having been accumulated at the charge accumulating section are to be read out, the TFT's 31, 31, ... of the active matrix layer 2 are actuated successively, and an image signal component, which is formed in accordance with the latent image charges corresponding to each of the pixels, is outputted through the output line. The image signal component is detected by the signal detecting means. The electrostatic latent image, which the latent image charges carry, is thus capable of being read out.

The bias electrode 7 maybe made from one of various materials, which have the transmissivity with respect to the X-rays. By way of example, the bias electrode 7 may be constituted of a thin gold film. The recording photoconductive layer 5 contains a-Se as the principal constituent and may be doped with an alkali metal. The term "principal constituent" as used herein means that the content of the constituent is equal to at least 50%.

The base plate 1 may be made from glass, a polyimide, a polycarbonate, a flexible base plate, which is constituted of a stainless steel metal plate having a thickness of approximately 0.1 mm and an electrical insulating thin film, such as an $SiO_2$ thin film, formed on the stainless steel metal plate. The electron blocking layer 3 acts to block or capture the electrons injected from the pixel electrode into the recording photoconductive layer 5. The electron blocking layer 3 may be constituted of an inorganic material, such as $Sb_2S_3$, $As_2Se_3$, $As_2S_3$, or CdSe; or an organic film, such as a PVK film, or a polycarbonate (PC) film added with hole transporting molecules. The layer thickness of the electron blocking layer 3 should preferably fall within the range of approximately 0.05 μm to approximately 5 μm.

Each of the crystallization preventing layer 4 and the crystallization preventing layer 4' may be constituted of an a-Se layer, which contains at least one kind of element selected from the group consisting of As, Sb, and Bi in a proportion falling within the range of 5% to 40%, preferably in a proportion falling within the range of 7% to 40%, more preferably in a proportion falling within the range of 10% to 40%. The proportion of the at least one kind of the element selected from the group consisting of As, Sb, and Bi may be selected appropriately in accordance with the level of the crystallization preventing effect. If the proportion of the at least one kind of the element selected from the group consisting of As, Sb, and Bi is lower than 5%, a sufficient crystallization preventing effect will not be capable of being obtained. Also, if the proportion of the at least one kind of the element selected from the group consisting of As, Sb, and Bi is higher than 40%, the metal element will be deposited, the resistance will become low locally, and image defects will arise. With each of the crystallization preventing layer 4 and the crystallization preventing layer 4', the occurrence of the crystallization at the contact interface with the electrode is capable of being suppressed.

The thermal deformation preventing layer 6 is constituted of the a-Se layer containing at least one kind of specific substance selected from the group consisting of the metal fluoride, the metal oxide, $SiO_x$, and $GeO_x$, where x represents a number satisfying $0.5 \leq x \leq 1.5$. In each of $SiO_x$ and $GeO_x$, x should preferably represent a number of x=1. The layer thickness of the thermal deformation preventing layer 6 should preferably fall within the range of 0.5 μm to 20 μm, and should more preferably fall within the range of 2 μm to 20 μm. If the layer thickness of the thermal deformation preventing layer 6 is smaller than 0.5 μm, the occurrence of the reticulations on the surface of the crystallization preventing layer 4' will not be capable of being suppressed sufficiently. If the layer thickness of the thermal deformation preventing layer 6 is larger than 20 μm, the X-ray sensitivity will be apt to become low.

The concentration of the specific substance in the thermal deformation preventing layer 6 should preferably fall within the range of 0.005 mol % to 5 mol %, and should more preferably fall within the range of 0.01 mol % to 0.5 mol %. If the concentration of the specific substance in the thermal deformation preventing layer 6 is lower than 0.005 mol %, the thermal deformation preventing effect will become small. Also, if the concentration of the specific substance in the thermal deformation preventing layer 6 is higher than 5 mol %, the entire region of a-Se acting as the matrix will become brittle, and cracking will become apt to occur with the passage of time.

The top region of the thermal deformation preventing layer 6, the bottom region of the thermal deformation preventing layer 6, or the entire region within the thermal deformation preventing layer 6 may be doped with As, Sb, Bi, or the like, in a proportion falling with a range such that the hole capture capability may not be lost.

As illustrated in FIG. 1, the thermal deformation preventing layer 6 should preferably be located such that the thermal deformation preventing layer 6 may be in direct contact with the recording photoconductive layer 5. Each of the thermal deformation preventing layer 6 and the recording photoconductive layer 5 contains a-Se as the matrix. The continuity of the bonding of a-Se at the contact interface between the thermal deformation preventing layer 6 and the recording photoconductive layer 5 is high, and therefore the barrier with respect to the electron transit characteristics is small. Therefore, in cases where the thermal deformation preventing layer 6 is located such that the thermal deformation preventing layer 6 may be in direct contact with the recording photoconductive layer 5, the electrons having been generated within the recording photoconductive layer 5 are capable of being swept out without being accumulated at the interface region, at which the recording photoconductive layer 5 and the thermal deformation preventing layer 6 are in contact with each other.

Each of the electron blocking layer 3, the crystallization preventing layer 4, the recording photoconductive layer 5, the thermal deformation preventing layer 6, the crystallization preventing layer 4', and the bias electrode 7 is capable of being formed with a known technique, such as a resistance heating vacuum evaporation technique or a co-vacuum evaporation technique.

Figure 2:
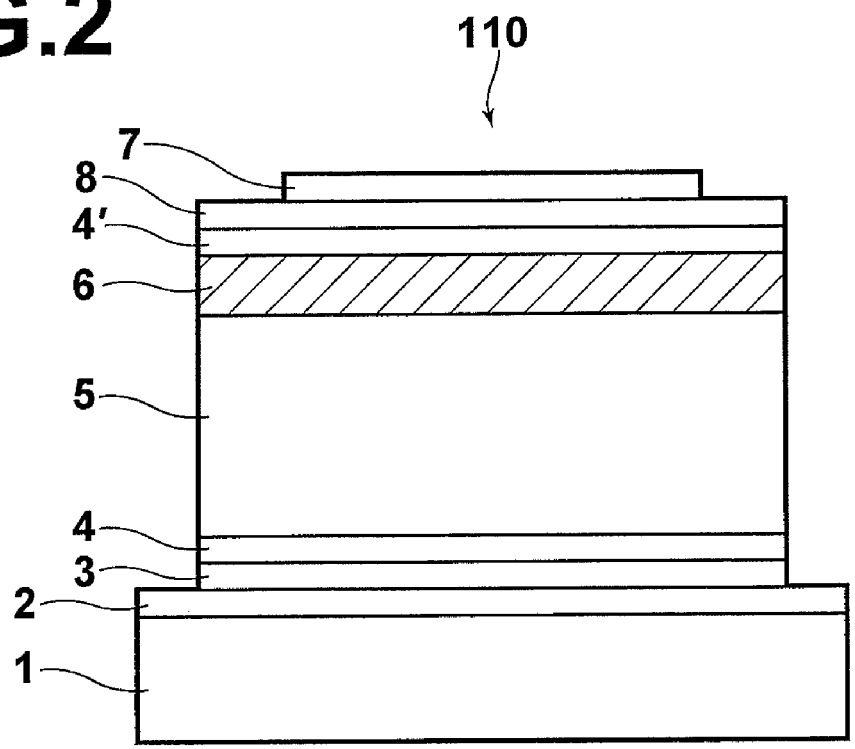
FIG. 2 is a schematic sectional view showing a second embodiment of the radiation image detector in accordance with the present invention.

FIG. 2 is a schematic sectional view showing a second embodiment of the radiation image detector in accordance with the present invention. In FIG. 2 (and in those that follow), similar elements are numbered with the same reference numerals with respect to FIG. 1. With reference to FIG. 2, a radiation image detector 110 comprises the base plate 1. The radiation image detector 110 also comprises the active matrix layer 2. The active matrix layer 2 is provided with the read-out circuit, which is constituted of the TFT's. The active matrix layer 2 is also provided with the accumulating capacitors and the charge collecting electrodes. The radiation image detector 110 further comprises the electron blocking layer 3. The radiation image detector 110 still further comprises the crystallization preventing layer 4. The radiation image detector 110 also comprises the recording photoconductive layer 5. The radiation image detector 110 further comprises the thermal deformation preventing layer 6. The radiation image detector 110 still further comprises the crystallization preventing layer 4'. The radiation image detector 110 also comprises a hole blocking layer 8. The radiation image detector 110 further comprises the bias electrode 7. The active matrix layer 2, the electron blocking layer 3, the crystallization preventing layer 4, the recording photoconductive layer 5, the thermal deformation preventing layer 6, the crystallization preventing layer 4', the hole blocking layer 8, and the bias electrode 7 are overlaid in this order on the base plate 1.

The second embodiment of the radiation image detector 110 illustrated in FIG. 2 is constituted basically in the same manner as that in the first embodiment of the radiation image detector 10 illustrated in FIG. 1, except that the hole blocking layer 8 is located between the crystallization preventing layer 4' and the bias electrode 7. The hole blocking layer 8 is the layer capable of blocking the holes and transmitting the electrons. The hole blocking layer 8 may be constituted of an inorganic film, such as an $Sb_2S_3$ film or a $CeO_2$ film; or an organic film, such as a polycarbonate (PC) film having been added with an electron transportable molecule, e.g., trinitrofluorenone (TNF). In cases where the hole blocking layer 8 is constituted of the $Sb_2S_3$ film, the layer thickness of the hole blocking layer 8 may vary in accordance with the $Sb_2S_3$ film forming conditions and should preferably fall within the range of approximately 0.1 μm to approximately 1 μm. It is presumed that the $Sb_2S_3$ film is capable of acting as the hole blocking layer since, principally, the interface with the a-Se layer, which is in contact with the $Sb_2S_3$ film, acts as the electric barrier. Also, the $Sb_2S_3$ film itself has the characteristics possessing localized levels for electron capture. Therefore, in cases where the layer thickness of the $Sb_2S_3$ film is larger than 2 μm, the electrons are not capable of passing through the film, and the $Sb_2S_3$ film becomes inappropriate for the hole blocking layer. Accordingly, in cases where the hole blocking layer 8 is constituted of the $Sb_2S_3$ film, the layer thickness of the hole blocking layer 8 should preferably be at most approximately 1 μm, and should more preferably be at most approximately 0.5 μm. Further, if the film thickness of the $Sb_2S_3$ film is markedly small, film peeling will be apt to occur. Therefore, the film thickness of the $Sb_2S_3$ film should preferably be at least approximately 0.1 μm.

Also, such that the hole blocking function of the $Sb_2S_3$ layer may be enhanced, the material of the bias electrode 7 should preferably be selected from materials (such as Au and Al) having a work function smaller than the work function of $Sb_2S_3$, and an electric potential barrier should preferably be formed at the interface between the $Sb_2S_3$ film and the electrode layer, which is in contact with the $Sb_2S_3$ layer. As described above, in cases where the layer thickness of the $Sb_2S_3$ layer is set to be equal to at most 2 μm, preferably at most 1 μm, more preferably at most 0.5 μm, the characteristics of rectification contact for blocking of hole injection become predominant over the characteristics as the electron blocking layer, and it becomes possible for the $Sb_2S_3$ layer to be used as the hole blocking layer. In cases where the hole blocking layer 8 is constituted of the $CeO_2$ film, the layer thickness of the $CeO_2$ film should preferably fall within the range of approximately 0.01 μm to approximately 0.03 μm. In cases where the hole blocking layer 8 is constituted of the organic film, such as the PC film having been added with the electron transporting molecule, the layer thickness of the organic film should preferably fall within the range of approximately 0.05 μm to approximately 0.3 μm.

As described above, in cases where the hole blocking layer 8 is located between the crystallization preventing layer 4' and the bias electrode 7, the insufficiency of the hole capture capability is capable of being compensated for in cases where the dopant concentration of the specific substance in the thermal deformation preventing layer 6 is low. Therefore, in such cases, the dark current is capable of being suppressed. Accordingly, in cases where the hole blocking layer 8 is provided, the concentration of the specific substance in the thermal deformation preventing layer 6 is capable of being suppressed to a value falling within the range of approximately 0.003 mol % to approximately 0.03 mol %. With the radiation image detector 110 in accordance with the present invention, wherein the hole blocking layer 8 is provided, the radiation image detector, in which thermal damage is capable of being kept lower and in which durability is longer, is capable of being obtained than in cases where the concentration of the specific substance in the thermal deformation preventing layer 6 is increased.

Figure 4:
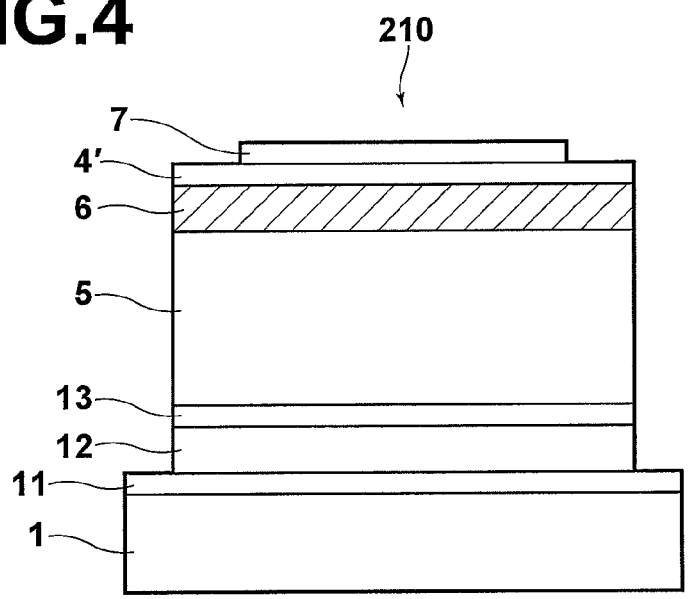
FIG. 4 is a schematic sectional view showing a third embodiment of the radiation image detector in accordance with the present invention, which is employed for an optical read-out technique.

FIG. 4 is a schematic sectional view showing a third embodiment of the radiation image detector in accordance with the present invention, which is employed for an optical read-out technique. With the optical read-out technique, the electric charges having been accumulated at the charge accumulating section are read out by the utilization of the semiconductor material, which is capable of generating the electric charges when being exposed to light. With reference to FIG. 4, a radiation image detector 210 comprises the base plate 1. The radiation image detector 210 also comprises linear electrodes 11, 11, . . . , which correspond to the charge collecting electrodes. The radiation image detector 210 further comprises a reading photoconductive layer 12. The radiation image detector 210 still further comprises a charge accumulating section 13. The radiation image detector 210 also comprises the recording photoconductive layer 5. The radiation image detector 210 further comprises the thermal deformation preventing layer 6. The radiation image detector 210 still further comprises the crystallization preventing layer 4'. The radiation image detector 210 also comprises the bias electrode 7. The linear electrodes 11, 11, . . . , the reading photoconductive layer 12, the charge accumulating section 13, the recording photoconductive layer 5, the thermal deformation preventing layer 6, the crystallization preventing layer 4', and the bias electrode 7 are overlaid in this order on the base plate 1.

In the cases of the radiation image detector 210 illustrated in FIG. 4, a reading line-like light source is scanned in a direction normal to each of the linear electrodes 11, 11, . . . , and the radiation image information is thus capable of being read out.

Figure 5:
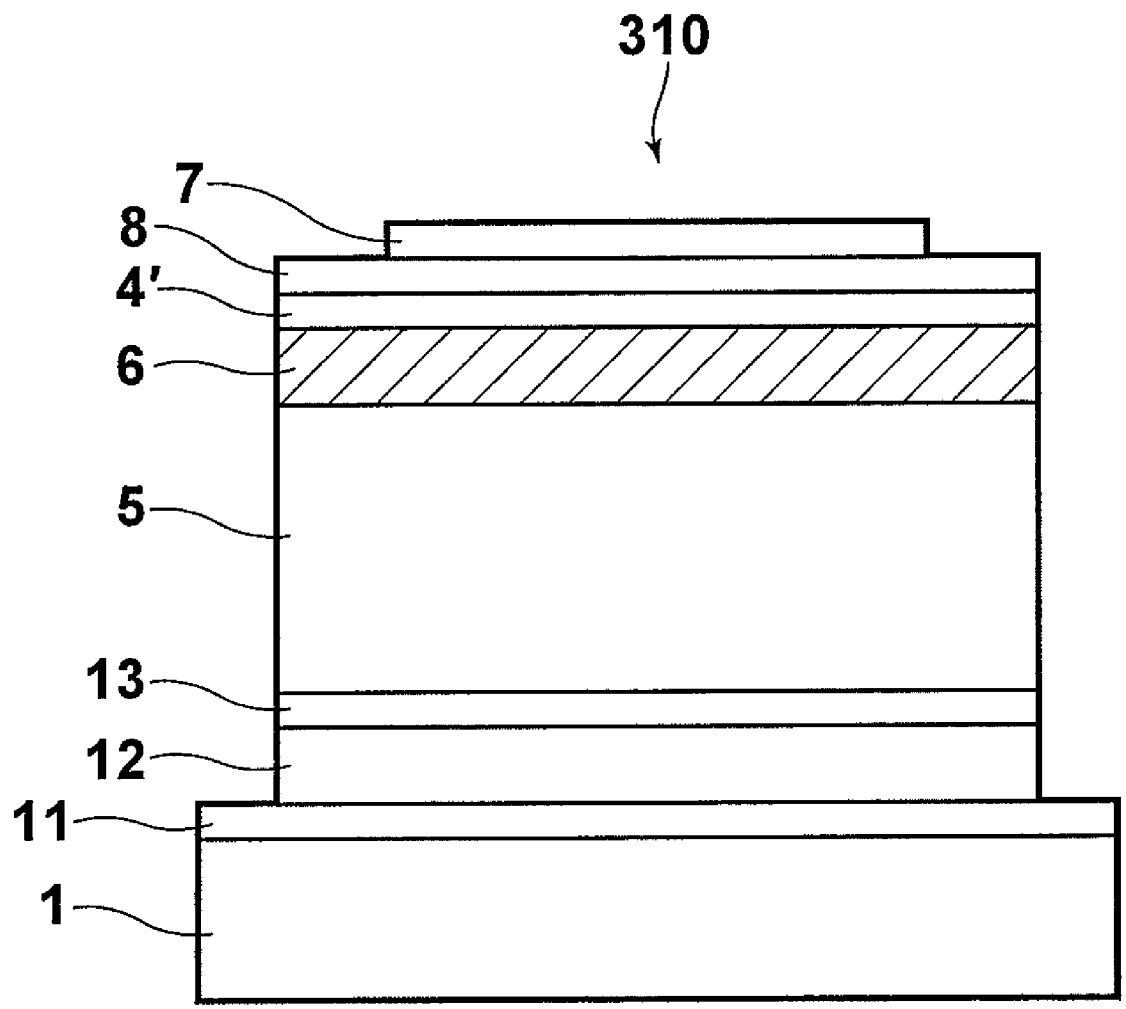
FIG. 5 is a schematic sectional view showing a fourth embodiment of the radiation image detector in accordance with the present invention, which is employed for the optical read-out technique.

FIG. 5 is a schematic sectional view showing a fourth embodiment of the radiation image detector in accordance with the present invention, which is employed for the optical read-out technique. The fourth embodiment of the radiation image detector 310 illustrated in FIG. 5 is constituted basically in the same manner as that in the third embodiment of the radiation image detector 210 illustrated in FIG. 4, except that the hole blocking layer 8 is located between the crystallization preventing layer 4' and the bias electrode 7. In the cases of the radiation image detector 310 illustrated in FIG. 5, at the time at which the electric charges of the charge accumulating section 13 are to be read out, the radiation image detector 310 is in the state in which the negative electric charges are accumulated at the charge accumulating section 13. Also, at the time of the readout of the electric charges of the charge accumulating section 13, the bias electrode 7 and the reference electrode, which is constituted of the linear electrodes 11, 11, . . ., are short-circuited with each other. Therefore, the reference electrode, which is constituted of the linear electrodes 11, 11, . . ., is at the positive electric potential with respect to the charge accumulating section 13 at the time of the readout of the electric charges of the charge accumulating section 13. Accordingly, the radiation image detector 310 may be modified such that the thermal deformation preventing layer 6 is located between the reference electrode, which is constituted of the linear electrodes 11, 11, . . ., and the recording photoconductive layer 5 (specifically, between the reference electrode, which is constituted of the linear electrodes 11, 11, . . ., and the reading photoconductive layer 12). As another alternative, the radiation image detector 310 may be modified such that the thermal deformation preventing layer 6 is located at each of the position between the recording photoconductive layer 5 and the crystallization preventing layer 4' and the position between the reference electrode, which is constituted of the linear electrodes 11, 11, . . ., and the recording photoconductive layer 5 (specifically, between the reference electrode, which is constituted of the linear electrodes 11, 11, . . ., and the reading photoconductive layer 12).

In the fourth embodiment of the radiation image detector 310 illustrated in FIG. 5, in cases where the hole blocking layer 8 is constituted of the $Sb_2S_3$ film, the layer thickness of the hole blocking layer 8 should preferably fall within the range of 0.1 µm to 0.5 µm. If the film thickness of the $Sb_2S_3$ film is smaller than 0.1 µm, film peeling will be apt to occur. Also, in cases where the layer thickness of the $Sb_2S_3$ layer is set to be equal to at most 0.5 µm, the characteristics of the rectification contact for the blocking of the hole injection become predominant over the characteristics as the electron blocking layer, and it becomes possible for the $Sb_2S_3$ layer to be used as the hole blocking layer.

In cases where the hole blocking layer 8 is located between the thermal deformation preventing layer 6 and the bias electrode 7, the insufficiency of the hole capture capability is capable of being compensated for in cases where the concentration of the specific substance in the thermal deformation preventing layer 6 is low. Therefore, in such cases, the dark current is capable of being suppressed. Accordingly, in cases where the hole blocking layer 8 is provided, the concentration of the specific substance in the thermal deformation preventing layer 6 is capable of being suppressed to a value falling within the range of approximately 0.003 mol % to approximately 0.03 mol %. With the radiation image detector 310 in accordance with the present invention, wherein the hole blocking layer 8 is provided, the radiation image detector, in which the thermal damage is capable of being kept lower and in which the durability is longer, is capable of being obtained than in cases where the concentration of the specific substance in the thermal deformation preventing layer 6 is increased.

EXAMPLES

Examples 1 to 20, Comparative Examples 1 to 4

A radiation image detector having the constitution identical with the constitution of the radiation image detector 10 illustrated in FIG. 1 was prepared in the manner described below.

Specifically, a base plate, on which switching TFT's and accumulating capacitors had been arrayed, was prepared. An electron blocking layer constituted of antimony sulfide ($Sb_2S_3$) and having a layer thickness of 2 µm was then formed on the base plate. Thereafter, a film was formed from an Se raw material containing As in a proportion of 3% by use of the vacuum evaporation technique, and a crystallization preventing layer having a layer thickness of 0.15 µm was formed on the electron blocking layer. Thereafter, a film was formed from an Se raw material containing Na in a proportion of 10 ppm by use of the vacuum evaporation technique, and a recording photoconductive layer constituted of amorphous Se and having a layer thickness of 200 µm was formed on the crystallization preventing layer.

Thereafter, as a thermal deformation preventing layer, an a-Se layer containing LiF was formed by use of the co-vacuum evaporation technique. Specifically, firstly, an Se raw material accommodated in a Ta boat was evaporated. After the vacuum evaporation rate of Se became stable at 1 µm/minute, the evaporation of an appropriate quantity of an LiF raw material was begun. More specifically, the LiF raw material was accommodated in an $Al_2O_3$ crucible, and the crucible was heated with a tungsten filament heater. (The radiation image detectors of Examples 1 to 20 and the radiation image detectors of Comparative Examples 2, 3, and 4 were prepared through appropriate adjustments of the quantity of the electric current applied to the tungsten filament heater with respect to time.) After the co-vacuum evaporation processing had been performed for a predetermined period of time, the vapor coming from the boat for LiF and the vapor coming from the boat for Se were cut off simultaneously by use of cell shutters, and each of the thermal deformation preventing layers having the thicknesses listed in Table 1 below was formed. (The layer thickness of each of the thermal deformation preventing layers was set by the adjustment of the vacuum evaporation processing time. In Comparative Example 1, the thermal deformation preventing layer was not formed.)

Thereafter, a film was formed from an Se raw material containing As in a proportion of 10% by use of the vacuum evaporation technique, and a crystallization preventing layer having a layer thickness of 0.15 µm was formed on the thermal deformation preventing layer having been formed in the manner described above. Further, an Au film was formed on the crystallization preventing layer by use of the vacuum evaporation technique, and a bias electrode having a layer thickness of 0.1 µm was thereby formed. Finally, a voltage applying electrode was formed on the bias electrode, and a peripheral actuation circuit was mounted on the TFT array X-ray electric charge converting film base plate. In this manner, each of the radiation image detectors was obtained.

Films identical with those described above were formed with the same constitutions as those described above with simultaneous processes on each of 5 cm-square glass base plates provided with an amorphous IZO layer. In this manner, each of reference detectors for measurement of the dark current and the X-ray sensitivity described above was prepared.

Examples 21, 22, and 23

A radiation image detector having the constitution identical with the constitution of the radiation image detector 110 illustrated in FIG. 2 was prepared in the manner described below.

Specifically, each of the radiation image detectors and the reference detectors was prepared in the same manner as that described above (for Examples 1 to 20, Comparative Examples 1 to 4), except that, after the thermal deformation preventing layer was formed as described above (for Examples 1 to 20, Comparative Examples 1 to 4), the crystallization preventing layer was formed in the same manner, and a hole blocking layer constituted of antimony sulfide ($Sb_2S_3$) and having a layer thickness of 0.3 μm was formed on the crystallization preventing layer.

(Measurement of Image Defects Before and After an Accelerated High Temperature Test)

TFT pixel size: 150 μm

Accelerated test: Three months at 40° C. (In cases where the accelerated test temperature was set at 40° C., and experiments were made with the accelerated test time being set at various different values, a difference in image defect increase was capable of being discriminated with the passage of time of the accelerated test of three months. Therefore, the conditions of three months at 40° C. were employed for the evaluation.)

Electric field application: Measurement was made at the stage 60 seconds after the application of a voltage of +2 kV to the bias electrode was performed.

With respect to each of the radiation image detectors having been prepared in the manner described above, a reticulate artifact at the stage after the accelerated test was made under the conditions described above was detected in the manner described below. Specifically, firstly, an offset image was acquired at the stage 60 seconds after the application of a voltage of +2 kV to the top electrode was performed. From the offset image, an accelerated test time period, which elapsed before the reticulate artifact having an abnormal image density exceeding a level five times as high as an image density fluctuation variance of the offset image appeared, was detected. Table 1 lists the accelerated test time period as a relative value with respect to the accelerated test time period of the radiation image detector of Comparative Example 1.

(Measurement of Dark Current and X-Ray Sensitivity)

A voltage of +2 kV was applied to the top electrode of the reference detector described above. Also, an ammeter was connected to the IZO layer, and the dark current was read out. As the dark current, the current value at the stage 60 seconds after the application of the bias voltage was performed was measured. The X-ray sensitivity was measured in the manner described below. Specifically, after a bias electric field was applied for 600 seconds, the X-rays having been produced under the conditions of a tube voltage of 28 kV (an Mo tube) and a tube current of 80 mA and having passed through an Mo filter (30 μm) and an Al filter (2 mm) were irradiated to the reference detector for a period of time of 710 msec. At this time, the quantity of the electric charges having been collected was measured and taken as the X-ray sensitivity. Table 1 lists each of the dark current and the X-ray sensitivity of each of the radiation image detectors of Examples 1 to 20 and Comparative Examples 2, 3, and 4 as a relative value with respect to the value in Comparative Example 1.

(Measurement of a Layer Thickness of a Thermal Deformation Preventing Layer)

The layer thickness of the thermal deformation preventing layer in the radiation image detector was measured in the manner described below. Specifically, the distribution of the concentration of Li having been added to the Se film, which was formed on an Si base plate by use of the simultaneous film formation processing, was measured by use of a secondary ion mass spectrometry (SIMS) technique. Also, a measurement was made to find the length of a region sandwiched between two interfaces, which were associated with the value of 10% of the maximum Li concentration in the thermal deformation preventing layer and which were disposed at the largest spacing from each other. Oxygen ions were employed as the primary ions to be used for the SIMS technique, and the measurement of the distribution of Li with respect to the depth direction was performed till a lower limit value of the detection limit was reached. After the SIMS measurement was finished, the depths of craters having been formed due to the measurement were measured directly by use of a stylus type surface level difference meter (P-10, supplied by KLA-Tencor Co.) and subjected to mean conversion as the value of the SIMS data end point.

Figure 6:
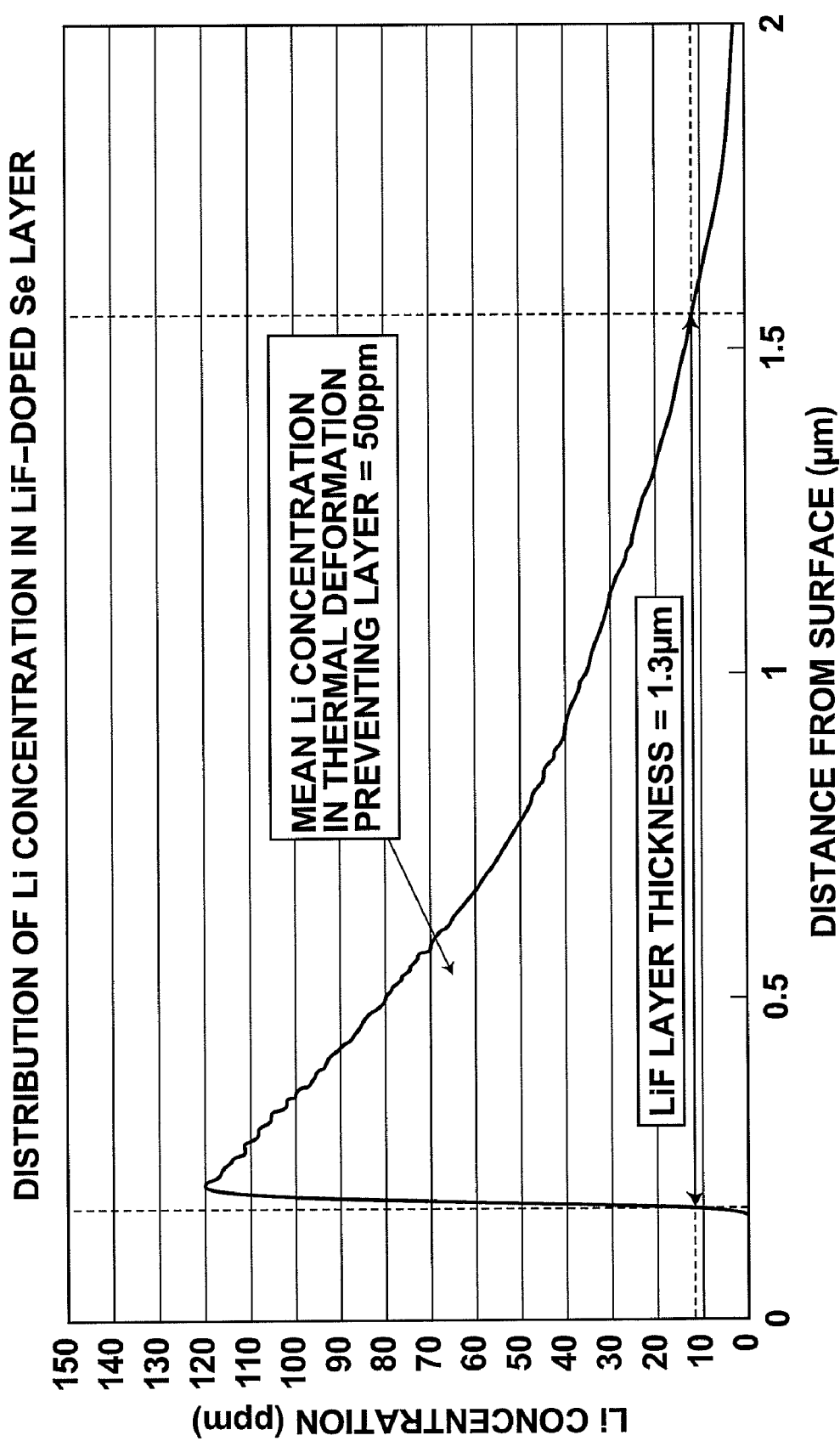
FIG. 6 is a graph showing a distribution of an Li concentration in a thermal deformation preventing layer, as measured with SIMS.

Table 2 lists the SIMS measurement conditions. FIG. 6 shows an example of measurement of a distribution of an Li concentration in a thermal deformation preventing layer in Example 8, as measured with SIMS. As illustrated in FIG. 6, the maximum Li concentration in the thermal deformation preventing layer in Example 8 was equal to approximately 120 ppm. Also, the length of the region sandwiched between the two interfaces, which were associated with the value of 10% of the maximum Li concentration in the thermal deformation preventing layer and which were disposed at the largest spacing from each other, was equal to 1.3 μm.

(Measurement of a Concentration of a Specific Substance in a Thermal Deformation Preventing Layer)

The LiF concentration in the thermal deformation preventing layer was represented by a mean Li concentration (mol) in the region sandwiched between the two interfaces, which were associated with the value of 10% of the maximum LiF concentration in the thermal deformation preventing layer and which were disposed at the largest spacing from each other. Specifically, all Li count numbers in the region sandwiched between the two interfaces described above are subjected to an integration operation, and the resulting Li count number was divided by the layer thickness of the thermal deformation preventing layer. The means Li count number per unit layer thickness having thus been obtained was converted into the Li concentration in accordance with the sensitivity correcting technique described later, and the mean Li concentration (mol) was thereby obtained. More specifically, as for the LiF molar concentration, the LiF concentration was expressed in terms of the Li concentration, and it was regarded that the measured concentration value of F (fluorine) might be low with respect to the concentration of Li. The sensitivity correcting technique described below was utilized.

Sensitivity correcting technique: A sample containing Se and LiF was prepared for used in sensitivity correction. Firstly, the Se concentration and the Li concentration were determined quantitatively by use of an ICP-MS analysis technique. Thereafter, the same sample was subjected to the SIMS measurement, and a sensitivity correction coefficient was calculated such that the Se concentration and the Li concentration might coincide with the SIMS measured values. The quantitative determination of the distribution of the Li concentration in a predetermined sample was made in accordance with the thus calculated sensitivity correction coefficient.

The LiF concentration is herein represented by the mean Li concentration (mol). In the same manner as that for Li, the distribution of the concentration of F (fluorine) is capable of being measured with the SIMS technique. In such cases, Cs ions may be employed as the primary ions for use in the SIMS technique.

Also, as for the molar concentration of the specific substance, such as the metal fluoride other than LiF, the metal oxide, $SiO_x$, or $GeO_x$, the molar concentration of the specific substance was expressed in terms of the concentration of the metal, Si, or Ge, respectively, and it was regarded that the measured concentration value of oxygen might be low with respect to the concentration of the metal, Si, or Ge, respectively.

was equal to 0.001 mol %, due to the low LiF concentration, a significant difference in X-ray sensitivity due to the difference of the layer thickness of the thermal deformation preventing layer was not found.) Further, as for each of the

TABLE 1

|  | Thermal deformation preventing layer | | Hole blocking layer | | Time before reticulation | Dark current | Sensitivity |
|---|---|---|---|---|---|---|---|
|  | LiF conc. (mol %) | Thickness (μm) | Substance | Thickness (μm) | (relative value) | (relative value) | (relative value) |
| Comp. Ex. 1 | — | — | — | — | 1 (reference) | 10 (reference) | 1 (reference) |
| Example 1 | 0.001 | 0.1 | — | — | 1.5 | 3 | 1 |
| Example 2 | 0.001 | 0.7 | — | — | 1.5 | 1 | 1 |
| Example 3 | 0.001 | 1.3 | — | — | 1.5 | 1 | 1 |
| Example 4 | 0.001 | 20 | — | — | 1.5 | 1 | 1 |
| Example 5 | 0.001 | 50 | — | — | 1.5 | 1 | 1 |
| Example 6 | 0.005 | 0.1 | — | — | 3 | 2 | 1 |
| Example 7 | 0.005 | 0.7 | — | — | 10 | 0.5 | 1 |
| Example 8 | 0.005 | 1.3 | — | — | 60 | 0.7 | 1 |
| Example 9 | 0.005 | 20 | — | — | 10000 | 1 | 1 |
| Example 10 | 0.005 | 50 | — | — | 10000 | 1 | 0.9 |
| Example 11 | 0.5 | 0.1 | — | — | 2 | 2 | 1 |
| Example 12 | 0.5 | 0.7 | — | — | 10 | 1 | 1 |
| Example 13 | 0.5 | 1.3 | — | — | 80 | 1 | 1 |
| Example 14 | 0.5 | 20 | — | — | 10000 | 1 | 1 |
| Example 15 | 0.5 | 50 | — | — | 10000 | 1 | 0.85 |
| Example 16 | 5 | 0.1 | — | — | 2.5 | 2 | 1 |
| Example 17 | 5 | 0.7 | — | — | 10 | 1 | 1 |
| Example 18 | 5 | 1.5 | — | — | 100 | 1 | 1 |
| Example 19 | 5 | 20 | — | — | 10000 | 1 | 1 |
| Example 20 | 5 | 50 | — | — | 10000 | 1 | 0.8 |
| Comp. Ex. 2 | 10 | 0.7 | — | — | Cracking | 1 | 1 |
| Comp. Ex. 3 | 10 | 1.5 | — | — | Cracking | 1 | 1 |
| Comp. Ex. 4 | 10 | 20 | — | — | Cracking | 1 | 1 |
| Example 21 | 0.005 | 1.3 | $Sb_2S_3$ | 0.3 | 100 | 1 | 1 |
| Example 22 | 0.5 | 0.7 | $Sb_2S_3$ | 0.3 | 120 | 1 | 1 |
| Example 23 | 5 | 0.7 | $Sb_2S_3$ | 0.3 | 160 | 1 | 1 |

TABLE 2

| Item | Li measurement |
|---|---|
| Primary ions | $O^{2+}$ |
| Primary ion energy (eV) | 3000 |
| Primary ion current (nA) | 40 |
| Scanning region (μm × μm) | 400 × 570 |
| Detection region (%) | 9 |
| Incidence angle (deg.) | 45 |
| Secondary ion polarity | Positive |
| Oxygen gas leak | None |
| Charge compensation | Performed |

As clear from Table 1, as for each of the radiation image detectors prepared in Examples 1 to 20, wherein the thermal deformation preventing layer was provided, the time period, which elapsed before the reticulate artifact appeared during the accelerated test, was significantly longer than in the radiation image detector prepared in Comparative Example 1, and the dark current was lower than in the radiation image detector prepared in Comparative Example 1. Also, as for each of the radiation image detectors prepared in Examples 6, 7, 8, 9, 11, 12, 13, 14, 16, 17, 18, and 19, wherein the LiF concentration fell within the range of 0.005 mol % to 5 mol % and wherein the layer thickness of the thermal deformation preventing layer was equal to at most 20 μm, the X-ray sensitivity was significantly higher than in the radiation image detectors prepared in Examples 10, 15, and 20, wherein the layer thickness of the thermal deformation preventing layer was equal to 50 μm. (As for each of the radiation image detectors prepared in Examples 1, 2, 3, 4, and 5, wherein the LiF concentration radiation image detectors prepared in Examples 1 to 20, wherein the LiF concentration was equal to at most 5 mol %, cracking did not occur. As for each of the radiation image detectors prepared in Comparative Examples 2, 3, and 4, wherein the LiF concentration was equal to 10 mol %, the cracking occurred.

Furthermore, as shown in Table 1, as for each of the radiation image detectors prepared in Examples 21, 22, and 23, wherein the $Sb_2S_3$ layer (having a layer thickness of 0.3 μm), which was the hole blocking layer constituted of a hard vitreous substance, was provided, the occurrence of the reticulate artifact was capable of being suppressed even further than in the other cases where the doping concentration in the thermal deformation preventing layer was identical. (A comparison may be made between Example 8 and Example 21, between Example 12 and Example 22, and between Example 17 and Example 23.) If the doping concentration in the thermal deformation preventing layer is set to be high, thermal damage in the production process will become large, and the problems with regard to the durability will occur. However, by the provision of the hole blocking layer, the doping concentration need not be set to be high.

Examples 24 to 43, Comparative Examples 5 to 8

A radiation image detector having the constitution identical with the constitution of the radiation image detector 210 illustrated in FIG. 4, which is employed for the optical readout technique, was prepared in the manner described below.

Specifically, a base plate, on which linear electrodes constituted of IZO had been arrayed, was prepared. A reading photoconductive layer constituted of a-Se and having a layer thickness of 10 μm was then formed on the base plate. Thereafter, a film was formed from an $As_2Se_3$ raw material by use of the vacuum evaporation technique, and a charge accumulating section constituted of amorphous $As_2Se_3$ and having a layer thickness of 1 μm was formed on the reading photoconductive layer. Thereafter, a film was formed from an Se raw material containing Na in a proportion of 10 ppm by use of the vacuum evaporation technique, and a recording photoconductive layer constituted of amorphous Se and having a layer thickness of 200 μm was formed on the charge accumulating section.

Thereafter, as a thermal deformation preventing layer, an a-Se layer containing LiF was formed by use of the co-vacuum evaporation technique. Specifically, firstly, an Se raw material accommodated in a Ta boat was evaporated. After the vacuum evaporation rate of Se became stable at 1 μm/minute, the evaporation of an LiF raw material was begun. More specifically, the LiF raw material was accommodated in an $Al_2O_3$ crucible, and the crucible was heated with a tungsten filament heater. (The radiation image detectors of Examples 24 to 43 and the radiation image detectors of Comparative Examples 6, 7, and 8 were prepared through appropriate adjustments of the quantity of the electric current applied to the tungsten filament heater with respect to time.) After the co-vacuum evaporation processing had been performed for approximately seven minutes, the vapor coming from the boat for LiF and the vapor coming from the boat for Se were cut off simultaneously by use of cell shutters, and each of the thermal deformation preventing layers having the thicknesses listed in Table 3 below was formed. (The layer thickness of each of the thermal deformation preventing layers was set by the adjustment of the vacuum evaporation processing time. In Comparative Example 5, the thermal deformation preventing layer was not formed.)

Thereafter, a film was formed from an Se raw material containing As in a proportion of 10% by use of the vacuum evaporation technique, and a crystallization preventing layer having a layer thickness of 0.15 μm was formed on the thermal deformation preventing layer having been formed in the manner described above. Further, an Au film was formed on the crystallization preventing layer by use of the vacuum evaporation technique, and a bias electrode having a layer thickness of 0.1 μm was thereby formed. Finally, a voltage applying electrode was formed on the bias electrode, and a read-out circuit was mounted on the IZO linear electrode base plate.

Examples 44, 45, and 46

A radiation image detector having the constitution identical with the constitution of the radiation image detector 310 illustrated in FIG. 5 was prepared in the manner described below.

Specifically, each of the radiation image detectors was prepared in the same manner as that described above (for Examples 24 to 43, Comparative Examples 6, 7, and 8), except that, after the thermal deformation preventing layer was formed as described above (for Examples 24 to 43, Comparative Examples 6, 7, and 8), the crystallization preventing layer was formed in the same manner, and a hole blocking layer constituted of antimony sulfide ($Sb_2S_3$) and having a layer thickness of 0.3 μm was formed on the crystallization preventing layer.

(Measurement of Image Defects Before and After an Accelerated High Temperature Test)

IZO linear electrode pitch (pixel size): 50 μm

Accelerated test: Three months at 40° C.

Electric field application: Measurement was made at the stage two seconds after the application of a voltage of −2 kV to the bias electrode was performed.

With respect to each of the radiation image detectors having been prepared in the manner described above, a reticulate artifact at the stage after the accelerated test was made under the conditions described above was detected in the manner described below. Specifically, firstly, the bias electrode was short-circuited at the stage two seconds after the application of a voltage of −2 kV to the bias electrode was performed, and a scanning operation with light having been produced by a line-like light source was performed in the direction normal to each of the linear electrodes. In this manner, an offset image was acquired. From the offset image, an accelerated test time period, which elapsed before the reticulate artifact having an abnormal image density exceeding a level five times as high as an image density fluctuation variance of the offset image appeared, was detected. Table 3 lists the accelerated test time period as a relative value with respect to the accelerated test time period of the radiation image detector of Comparative Example 5.

(Measurement of Dark Current and X-Ray Sensitivity)

A voltage of −2 kV was applied for two seconds to the bias electrode of the radiation image detector. During the voltage application, the X-rays having been produced under the conditions of a tube voltage of 28 kV (an Mo tube) and a tube current of 80 mA and having passed through an Mo filter (30 μm) and an Al filter (2 mm) were irradiated to the radiation image detector for a period of time of 710 msec, and an X-ray image was accumulated at the charge accumulating section. Thereafter, the bias electrode was short-circuited, and the image was read out during the period of time falling within the range of one second to five seconds after the short-circuiting was performed. The signal quantity at the region having been irradiated to the X-rays was taken as the X-ray sensitivity. The detection quantity at the region having not been irradiated to the X-rays was taken as the dark current. Table 3 lists each of the dark current and the X-ray sensitivity of each of the radiation image detectors of Examples 24 to 46 and Comparative Examples 6, 7, and 8 as a relative value with respect to the value in Comparative Example 5.

TABLE 3

| | Thermal deformation preventing layer | | Hole blocking layer | | Time before reticulation | Dark current | Sensitivity |
|---|---|---|---|---|---|---|---|
| | LiF conc. (mol %) | Thickness (μm) | Substance | Thickness (μm) | (relative value) | (relative value) | (relative value) |
| Comp. Ex. 5 | — | — | — | — | 1 (reference) | 10 (reference) | 1 (reference) |
| Example 24 | 0.001 | 0.1 | — | — | 1.1 | 8 | 1 |
| Example 25 | 0.001 | 0.7 | — | — | 1.1 | 1 | 1 |
| Example 26 | 0.001 | 1.3 | — | — | 1.2 | 1 | 1 |

TABLE 3-continued

| | Thermal deformation preventing layer | | Hole blocking layer | | Time before reticulation | Dark current | Sensitivity |
|---|---|---|---|---|---|---|---|
| | LiF conc. (mol %) | Thickness (μm) | Substance | Thickness (μm) | (relative value) | (relative value) | (relative value) |
| Example 27 | 0.001 | 20 | — | — | 1.3 | 1 | 1 |
| Example 28 | 0.001 | 50 | — | — | 1.3 | 1 | 1 |
| Example 29 | 0.005 | 0.1 | — | — | 1.5 | 2 | 1 |
| Example 30 | 0.005 | 0.7 | — | — | 10 | 1 | 1 |
| Example 31 | 0.005 | 1.3 | — | — | 60 | 1 | 1 |
| Example 32 | 0.005 | 20 | — | — | 10000 | 1 | 1 |
| Example 33 | 0.005 | 50 | — | — | 10000 | 1 | 0.9 |
| Example 34 | 0.5 | 0.1 | — | — | 2 | 2 | 1 |
| Example 35 | 0.5 | 0.7 | — | — | 10 | 1 | 1 |
| Example 36 | 0.5 | 1.3 | — | — | 80 | 1 | 1 |
| Example 37 | 0.5 | 20 | — | — | 10000 | 1 | 1 |
| Example 38 | 0.5 | 50 | — | — | 10000 | 1 | 0.85 |
| Example 39 | 5 | 0.1 | — | — | 2.5 | 2 | 1 |
| Example 40 | 5 | 0.7 | — | — | 10 | 1 | 1 |
| Example 41 | 5 | 1.5 | — | — | 100 | 1 | 1 |
| Example 42 | 5 | 20 | — | — | 10000 | 1 | 1 |
| Example 43 | 5 | 50 | — | — | 10000 | 1 | 0.8 |
| Comp. Ex. 6 | 10 | 0.7 | — | — | Cracking | 1 | 1 |
| Comp. Ex. 7 | 10 | 1.5 | — | — | Cracking | 1 | 1 |
| Comp. Ex. 8 | 10 | 20 | — | — | Cracking | 1 | 1 |
| Example 44 | 0.005 | 1.3 | $Sb_2S_3$ | 0.3 | 100 | 1 | 1 |
| Example 45 | 0.5 | 0.7 | $Sb_2S_3$ | 0.3 | 120 | 1 | 1 |
| Example 46 | 5 | 0.7 | $Sb_2S_3$ | 0.3 | 160 | 1 | 1 |

As clear from Table 3, as for each of the radiation image detectors prepared in Examples 24 to 43, wherein the thermal deformation preventing layer was provided, the time period, which elapsed before the reticulate artifact appeared during the accelerated test, was significantly longer than in the radiation image detector prepared in Comparative Example 5, and the dark current was lower than in the radiation image detector prepared in Comparative Example 5. Also, as for each of the radiation image detectors prepared in Examples 29, 30, 31, 32, 34, 35, 36, 37, 39, 40, 41, and 42, wherein the LiF concentration fell within the range of 0.005 mol % to 5 mol % and wherein the layer thickness of the thermal deformation preventing layer was equal to at most 20 μm, the X-ray sensitivity was significantly higher than in the radiation image detectors prepared in Examples 33, 38, and 43, wherein the layer thickness of the thermal deformation preventing layer was equal to 50 μm. (As for each of the radiation image detectors prepared in Examples 24, 25, 26, 27, and 28, wherein the LiF concentration was equal to 0.001 mol %, due to the low LiF concentration, a significant difference in X-ray sensitivity due to the difference of the layer thickness of the thermal deformation preventing layer was not found.) Further, as for each of the radiation image detectors prepared in Examples 24 to 43, wherein the LiF concentration was equal to at most 5 mol %, cracking did not occur. As for each of the radiation image detectors prepared in Comparative Examples 6, 7, and 8, wherein the LiF concentration was equal to 10 mol %, the cracking occurred.

Furthermore, as shown in Table 3, as for each of the radiation image detectors prepared in Examples 44, 45, and 46, wherein the $Sb_2S_3$ layer (having a layer thickness of 0.3 μm), which was the hole blocking layer constituted of a hard vitreous substance, was provided, the occurrence of the reticulate artifact was capable of being suppressed even further than in the other cases where the doping concentration in the thermal deformation preventing layer was identical. (A comparison may be made between Example 31 and Example 44, between Example 35 and Example 45, and between Example 40 and Example 46.) If the doping concentration in the thermal deformation preventing layer is set to be high, thermal damage in the production process will become large, and the problems with regard to the durability will occur. However, by the provision of the hole blocking layer, the doping concentration need not be set to be high.

In Examples 1 to 46 described above, only LiF (which is one of the alkali metal fluorides) is exemplified as the specific substance. However, as the specific substance, it is possible to employ at least one kind of substance selected from the group consisting of the alkali metal fluoride, the alkaline earth metal fluoride, the alkali metal oxide, the alkaline earth metal oxide, $SiO_x$, and $GeO_x$, where x represents a number satisfying $0.5 \leq x \leq 1.5$. It is also possible to employ an oxide or a fluoride of a metal, such as Mn, Cu, Mo, or In, other than the alkali metal and the alkaline earth metal.

The above-enumerated specific substances have approximately identical levels of the characteristics with respect to the prevention of the thermal deformation in a-Se. Also, it is considered that the above-enumerated specific substances are present in the molecule forms in a-Se and are not apt to diffuse in a-Se. Further, the above-enumerated specific substances often form localized levels for the capture of holes and/or electrons in a-Se. Therefore, the specific substance maybe selected appropriately from the view point of the thermal deformation preventing effect, the dark current, the stability in iterated use, or the like.

What is claimed is:

1. A radiation image detector, comprising:
   i) a base plate,
   ii) a reference electrode constituted of a plurality of electrodes,
   iii) a recording photoconductive layer, which contains a-Se as a principal constituent, iv) a crystallization preventing layer, which is constituted of an a-Se layer containing at least one kind of element selected from the group consisting of As, Sb, and Bi, and v) a bias electrode, the reference electrode, the recording photoconductive layer, the crystallization preventing layer, and the bias electrode being overlaid in this order on the base plate, a thermal deformation preventing layer being located between the recording photoconductive layer and the crystallization preventing layer, the thermal deformation preventing layer being constituted of an a-Se layer containing at least one kind of specific substance selected from the group consisting of a metal fluoride, a metal oxide, $SiO_x$, and $GeO_x$, where x represents a number satisfying $0.5 \leq x \leq 1.5$.

2. A radiation image detector as defined in claim 1 wherein the thermal deformation preventing layer has a layer thickness falling within the range of 0.5 μm to 20 μm.

3. A radiation image detector as defined in claim 1 wherein a concentration of the specific substance falls within the range of 0.005 mol % to 5 mol %.

4. A radiation image detector as defined in claim 2 wherein a concentration of the specific substance falls within the range of 0.005 mol % to 5 mol %.

5. A radiation image detector as defined in claim 1 wherein a hole blocking layer is located between the thermal deformation preventing layer and the bias electrode.

6. A radiation image detector as defined in claim 2 wherein a hole blocking layer is located between the thermal deformation preventing layer and the bias electrode.

7. A radiation image detector as defined in claim 3 wherein a hole blocking layer is located between the thermal deformation preventing layer and the bias electrode.

8. A radiation image detector as defined in claim 4 wherein a hole blocking layer is located between the thermal deformation preventing layer and the bias electrode.

* * * * *